United States Patent [19]
Park et al.

[11] Patent Number: 5,840,591
[45] Date of Patent: Nov. 24, 1998

[54] METHOD OF MANUFACTURING BURIED BIT LINE DRAM CELL

[75] Inventors: Jae-Kwan Park, Kyungki-do; Jong-Woo Park, Seoul, both of Rep. of Korea

[73] Assignee: Samsung Electronics Co., Ltd., Suwon, Rep. of Korea

[21] Appl. No.: 565,029

[22] Filed: Nov. 30, 1995

[30] Foreign Application Priority Data

Nov. 30, 1994 [KR] Rep. of Korea ............... 1994 32137

[51] Int. Cl.⁶ .................................................. H01L 21/70
[52] U.S. Cl. ............................ 437/52; 437/47; 437/60; 437/203
[58] Field of Search ............................ 437/47, 48, 52, 437/60, 203

[56] References Cited

U.S. PATENT DOCUMENTS

| | | | |
|---|---|---|---|
| 5,618,745 | 4/1997 | Kita | 438/164 |
| 5,627,092 | 5/1997 | Alsmeier et al. | 438/152 |
| 5,629,226 | 5/1997 | Ohtsuki | 438/389 |

*Primary Examiner*—John Niebling
*Assistant Examiner*—Joni Y. Chang
*Attorney, Agent, or Firm*—Cushman Darby & Cushman IP Group of Pillsbury Madison & Sutro LLP

[57] ABSTRACT

A buried bit line DRAM cell and a manufacturing method thereof are provided. The buried bit line DRAM cell has a buried bit line formed into a trench which isolates devices, the buried bit line being isolated from a semiconductor substrate, a gate formed to be orthogonal to the bit line on the substrate, a first insulating layer formed to insulate the gate, a source and a drain of a transistor formed on the substrate at both sides of the gate, a self-aligned bit line contact formed between the first insulating layers for making contact between the drain and the buried bit line, and a self-aligned buried contact formed between the first insulating layers for making contact between the source and a storage electrode. According to the above structure, misalignment between the gate and the bit line and the excessive exposure to thermal processing which are inherent in conventional Buried Bit Line cells can be avoided and the design rule margin can be improved.

6 Claims, 9 Drawing Sheets

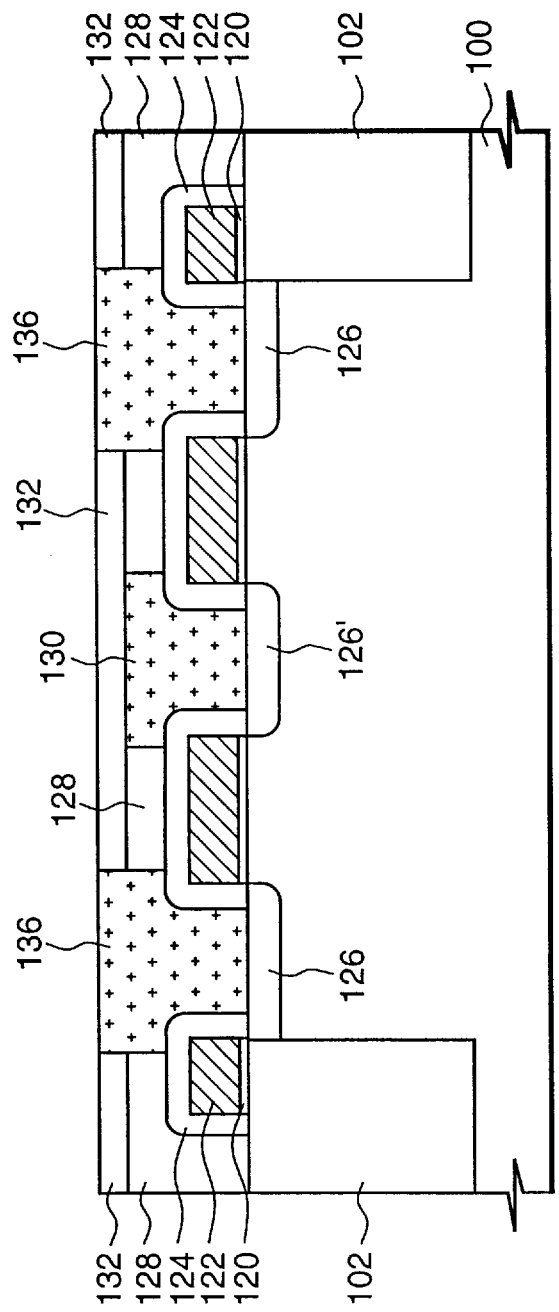

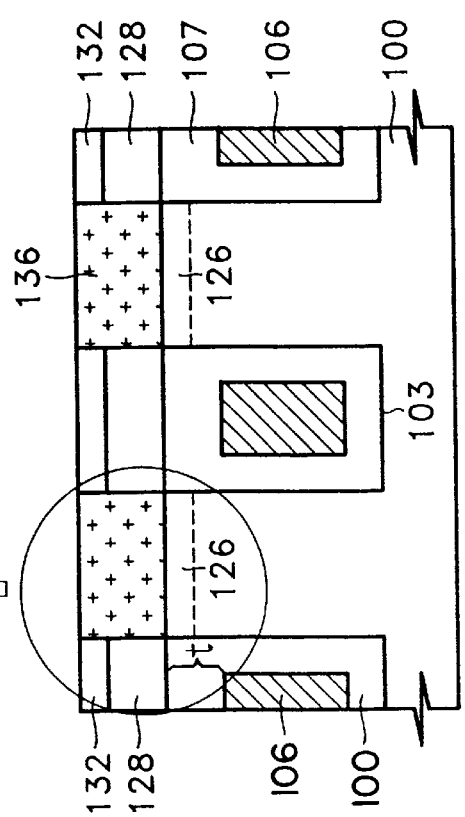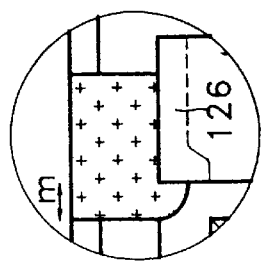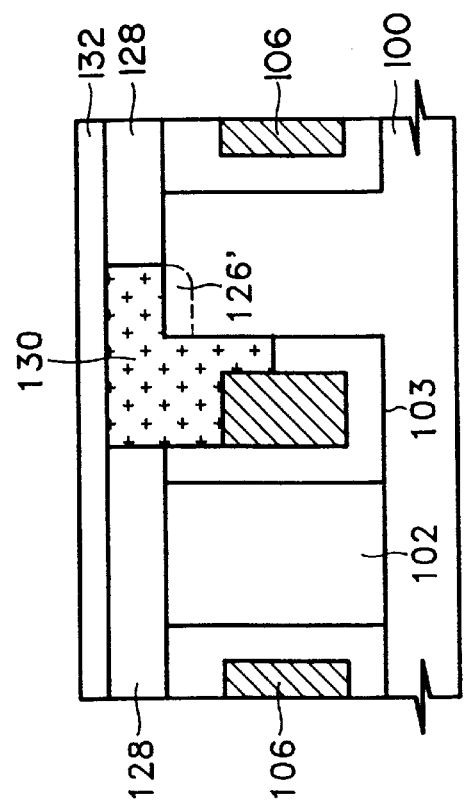

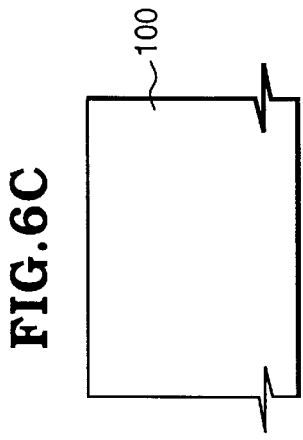
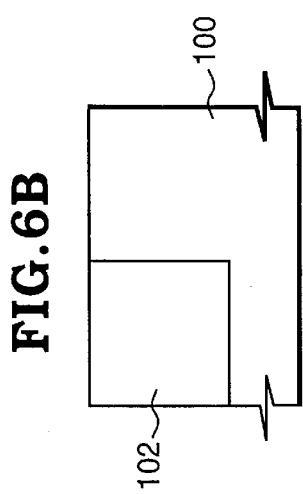
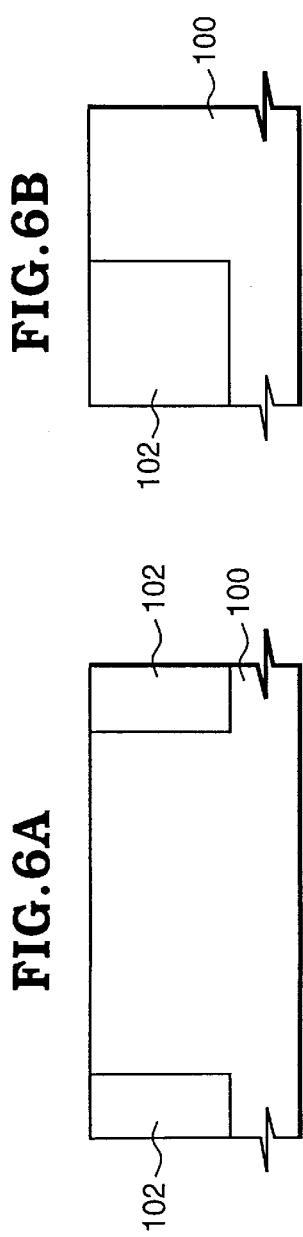
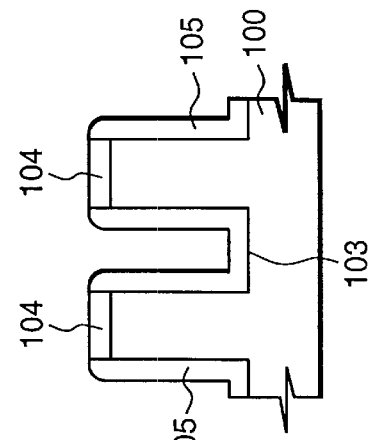
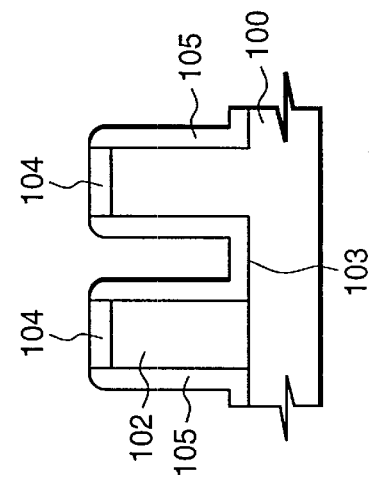
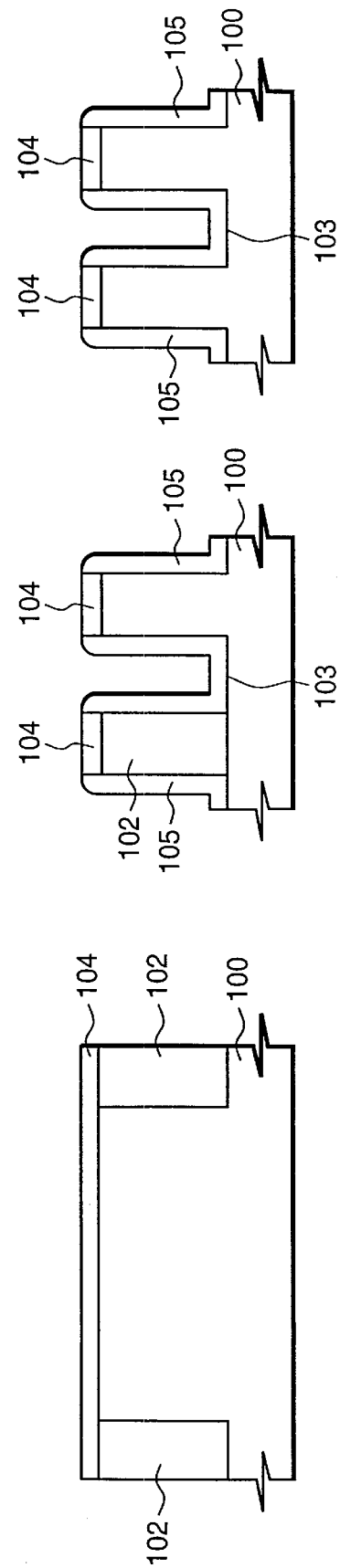

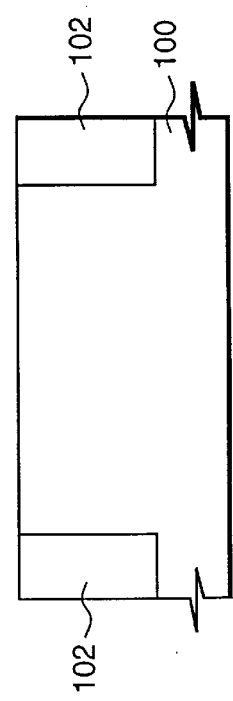
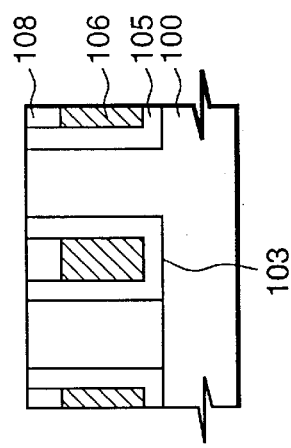
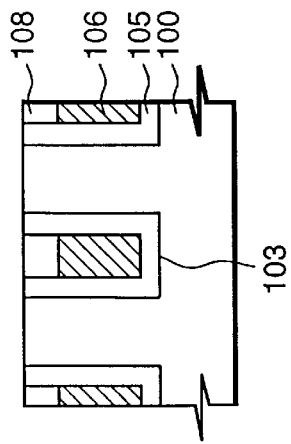
FIG. 8A
FIG. 8B
FIG. 8C
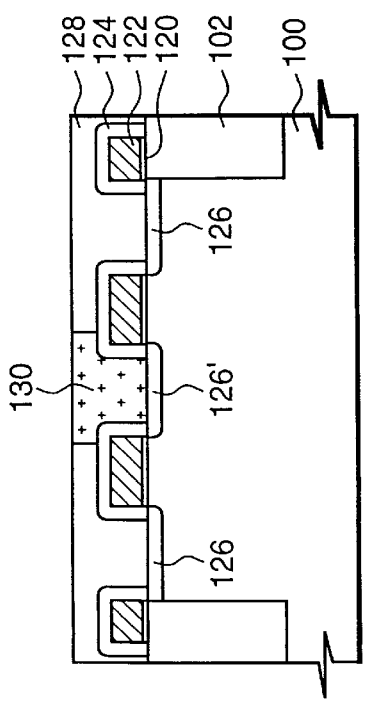
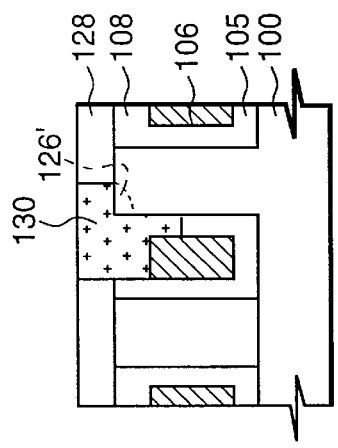
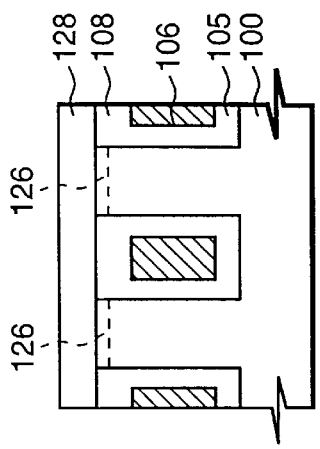
FIG. 9A
FIG. 9B
FIG. 9C

METHOD OF MANUFACTURING BURIED BIT LINE DRAM CELL

BACKGROUND OF THE INVENTION

The present invention relates to a semiconductor memory device and its manufacturing method. Move particularly, the present invention relates to a buried bit line (BBL) DRAM cell having a bit line buried in a device isolation region to reduce cell area and its manufacturing method in which bit line contact is improved.

As the integration level of semiconductor memory devices increases, the area that each cell occupies decreases. To respond to the reduction in cell size and to increase cell capacitance by increasing the effective area of the capacitor, stacked and trench capacitor structures have been suggested.

Due to high integration of DRAMs, the horizontal cell size has been reduced at a rate of almost ½ the size of each former generation. Reduction of cell size has been strictly horizontal, however, and not accompanied by a vertical scale-down. Thus, difficulties are encountered in forming fine patterns. To scale-down the entire DRAM cell, priority must be given to vertical scale-down as well as the decrease of design rules.

In an effort to achieve vertical scale-down, a BBL cell having a bit line buried in a device isolation region of a stacked cell has been suggested in "Buried Bit-Line Cell for 64 Mb DRAMs" the Symposium on VLSI Technology, 1990.

FIGS. 1 through 3E are for describing the suggested BBL cell. FIG. 1 is a layout drawing for forming the BBL cell and FIG. 2 is a vertical sectional view of FIG. 1, in the X direction.

In FIG. 1, reference numeral 2 denotes a mask pattern for forming a first field oxide film, reference numeral 3 denotes a mask pattern for a bit line, reference numeral 4 denotes a mask pattern for a bit line contact, reference numeral 5 denotes a mask pattern for forming a gate electrode, and reference numeral 6 denotes a mask pattern for forming a storage electrode.

As shown in FIG. 2, field oxide film 2, buried bit line 3, bit line contact or lateral bit line contact 4, gate electrode 5, and storage electrode 6 are formed on a semiconductor substrate.

FIGS. 3A through 3E are simplified drawings of the steps for manufacturing the suggested BBL cell.

As shown in FIG. 3A, pad oxide film 11 and silicon nitride film 14 are formed on semiconductor substrate 10, and then a first field oxide film denoted by reference numeral 2 in FIG. 2 is formed by a conventional local oxidation of silicon (LOCOS) method. Thereafter, trenches t are formed by using silicon nitride film 14 as a mask, and a second field oxide film 12 is formed along the inner walls of trenches t by a conventional thermal oxidation process.

As shown in FIG. 3B, a photoresist is coated on the resultant structure thereby forming photoresist pattern 16.

As shown in FIG. 3C, a bit line contact hole h for making contact between a bit line and the substrate is formed by etching second field oxide film 12, using photoresist pattern 16 as a mask. Then, a thin polysilicon layer 17 is formed by depositing polysilicon on the overall surface of the resultant structure having bit line contact hole h. A contact plug 18 is formed into substrate 10 adjacent to bit line contact hole h by implanting As ions into polysilicon layer 17.

As shown in FIG. 3D, polysilicon layer 17 is removed, and a bit line material such as polysilicon or a refractory metal silicide is deposited on the overall surface of the resultant structure having bit line contact plug 18 formed therein, while filling the trenches. Thus, bit line 20 is formed.

As shown in FIG. 3E, a third field oxide film 22 is formed on the substrate having bit line 20 formed therein and silicon nitride film 14 is removed. The remaining steps needed for forming a gate of a transistor and a capacitor are performed by conventional methods.

The above BBL cell structure makes vertical scale-down possible and prevents coupling between bit lines by burying the bit lines in device isolation regions of a cell.

However, the BBL cell has several drawbacks: it is difficult to form photoresist pattern 16 for forming bit line contact hole h (see FIG. 3B); the possible misalignment of the bit line contact (denoted by reference numeral 4 in FIG. 2) and the gate electrode (denoted by reference numeral 5 in FIG. 2) is likely to degrade the punch-through characteristics of a the cell transistor; since the ion-implantation step for forming impurity region 18 adjacent to bit line contact hole h is performed in an earlier stage, impurity region 18 undergoes excessive thermal processing in a subsequent step, thereby making the formation of a shallow junction difficult; and there is a high probability that stresses occurring on a substrate in the course of the lateral oxidation (for forming second field oxide film 12) and the upper oxidation (for forming third field oxide film 22) will impede device operation.

SUMMARY OF THE INVENTION

It is an object of the present invention to provide a BBL DRAM cell in which a self-aligned bit line and the drain of the transistor are brought into contact after the gate is formed.

It is another object of the present invention to provide a suitable method for manufacturing the BBL DRAM cell.

To achieve the above objects, there is provided a BBL DRAM cell comprising:

a buried bit line formed into a trench, which isolates devices, to be isolated from a semiconductor substrate;

a gate formed to be orthogonal to the bit line on the substrate;

a first insulating layer formed to insulate the gate;

a source and a drain of a transistor formed on the substrate at both sides of the gate;

a self-aligned bit line contact formed between the first insulating layers for making contact between the drain and the buried bit line; and a self-aligned buried contact formed between the first insulating layers for making contact between the source and a storage electrode.

Further device isolation can be achieved by adding a partially formed device isolation region on the semiconductor substrate.

To achieve another object of the present invention, there is provided a method for manufacturing a BBL DRAM cell comprising the steps of:

forming a trench into a semiconductor substrate for isolating devices and burying a bit line;

forming a first material layer on the surface of the trench;

forming the bit line to a predetermined depth into the trench having the first material layer formed thereon;

forming a second material layer on the bit line while filling the remaining portion of the trench, and planarizing the substrate;

forming a transistor having a gate insulating layer, a source/drain, and a gate on the planarized substrate;

forming a first insulating layer to insulate the gate;

forming a second insulating layer on the resultant structure having the first insulating layer;

exposing the drain of the transistor and the bit line by partially etching the second insulating layer;

forming a bit line contact plug for making contact between the drain and the bit line by depositing a conductive material on the resultant structure;

forming a third insulating layer on the resultant structure having the bit line contact plug formed therein and etching the third and second insulating layers to expose the source of the transistor; and forming a buried contact plug by depositing a conductive material on the resultant structure and etching back the conductive material.

Preferably, the trench is formed to a depth of 3,500–4,500 Å and the second material layer is formed to a thickness of 1,000–2,000 Å. The first and second material layers are preferably formed of an oxide.

In the step of partial etching the second insulating layer, it is desired to sufficiently expose the buried bit line by over-etching the second insulating layer.

In addition, the etch rate of the first insulating layer is different from that of the second or third insulating layer.

According to the above structure and method, misalignment between gate and bit line and excessive exposure to thermal processing which are involved in the conventional BBL cell, can be solved and the design rule margin can be improved by forming a self-aligned bit line contact after the formation of the gate.

BRIEF DESCRIPTION OF THE DRAWINGS

The above objects and advantages of the present invention will become more apparent by describing in detail a preferred embodiment thereof with reference to the attached drawings in which:

FIGS. 5A, 5B, 5C and 5D are vertical sectional views of the BBL DRAM cell according to the present invention; and FIGS. 6A through 10C illustrate the steps for manufacturing the BBL DRAM cell according to the present invention.

DETAILED DESCRIPTION OF THE INVENTION

Figure 1:
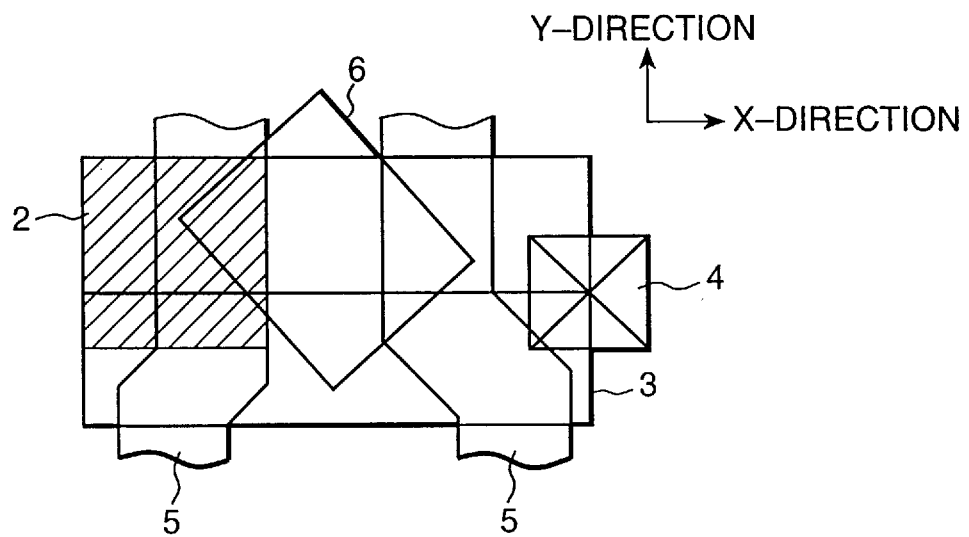
FIG. 1 is a layout drawing of a portion of mask patterns for forming a conventional BBL cell.
Figure 2:
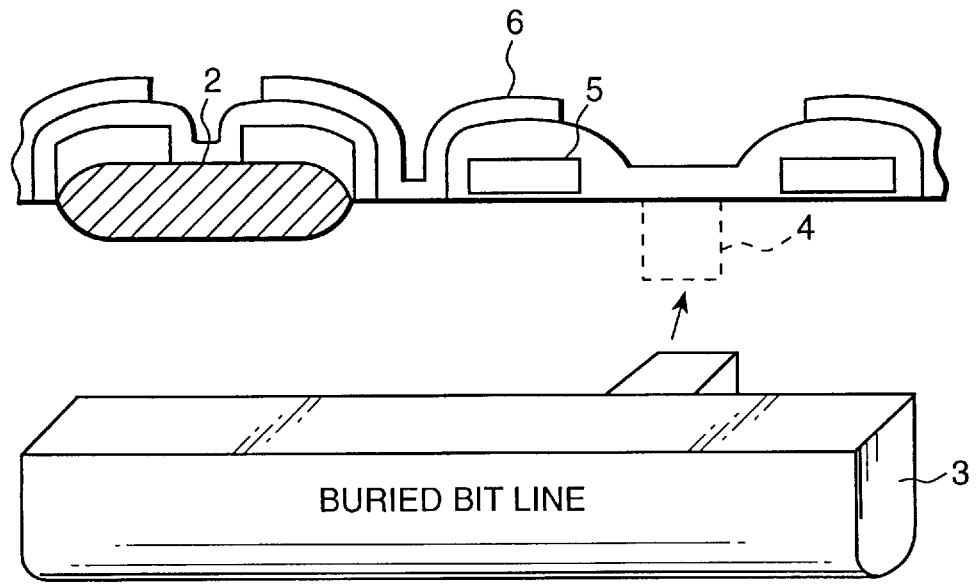
FIG. 2 is a vertical sectional view of FIG. 1, in the X-direction.
Figure 3A:
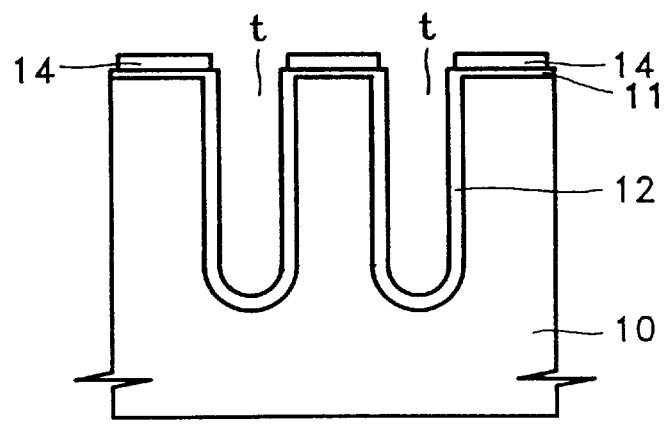
FIGS. 3A through 3E illustrate the steps for manufacturing the conventional BBL cell.
Figure 3B:
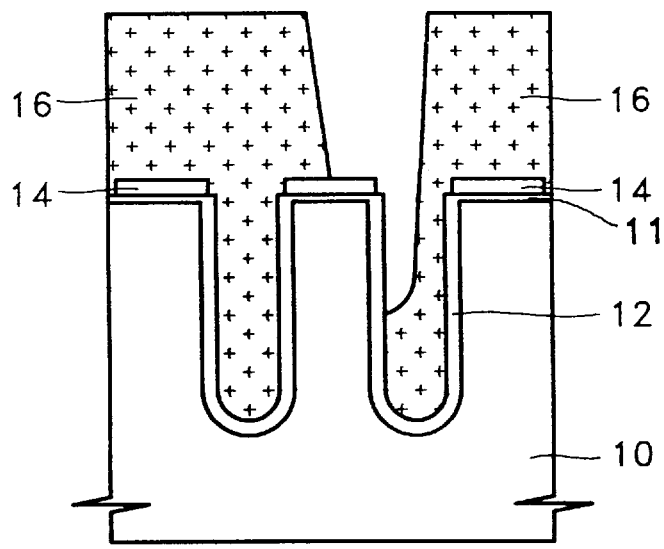
Figure 3C:
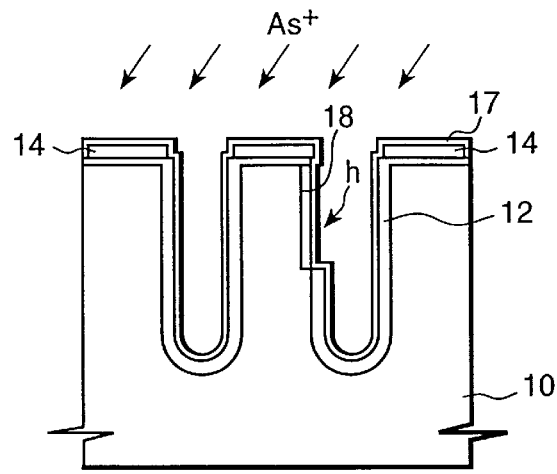
Figure 3D:
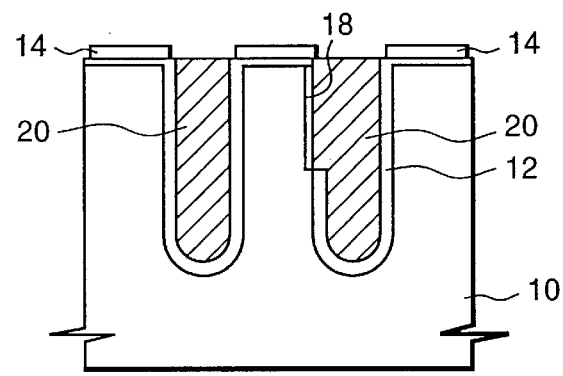
Figure 3E:
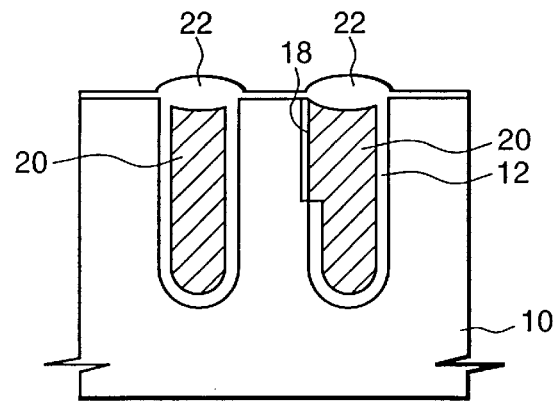

The present invention will be described in detail, referring to the attached drawings.

The same reference numerals in FIGS. 4 through 10C denote the same elements.

Figure 4:
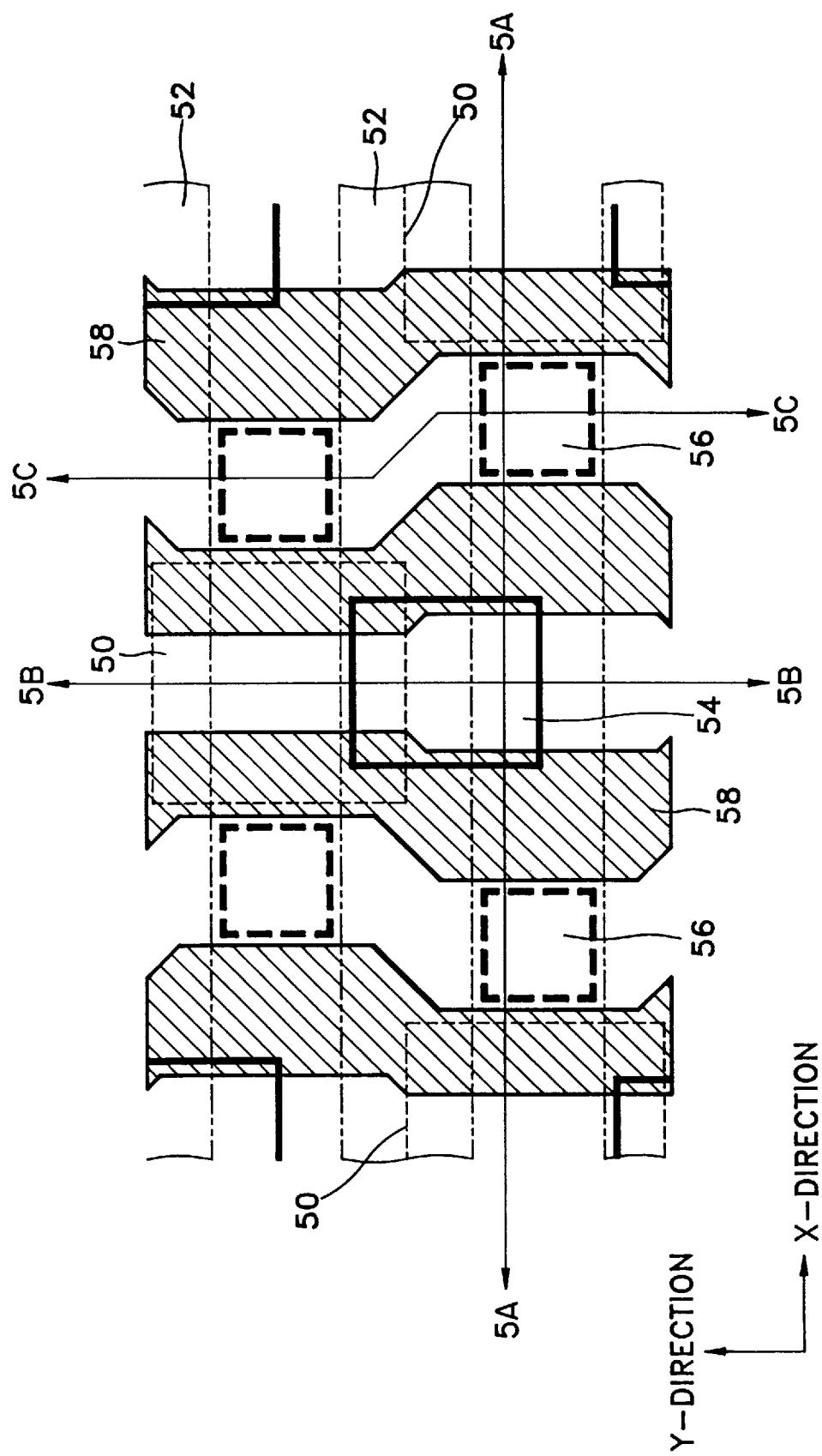
FIG. 4 is a layout drawing of a BBL DRAM cell according to the present invention.

FIG. 4 is a layout drawing showing a portion of mask patterns for manufacturing a BBL DRAM cell according to the present invention. As shown in FIG. 4, reference numeral 50 denotes a mask pattern for forming a device isolation region in the X-direction which defines a device active region, reference numeral 52 denotes a mask pattern for forming a device isolation region and a buried bit line which define the device active region in Y-direction, reference numeral 54 denotes a mask pattern for forming a bit line contact, a reference numeral 56 denotes a mask pattern for forming a buried contact, and reference numeral 58 denotes a mask pattern for forming a gate.

FIGS. 5A, 5B, and 5C are vertical sectional views of FIG. 4 along line 5A—5A, line 5B—5B, and 5C—5C, respectively.

As shown in FIG. 5A, reference numeral 100 denotes a semiconductor substrate, reference numeral 102 denotes the device isolation region defined by mask pattern 50 shown in FIG. 4, reference numeral 120 denotes a gate insulating film, reference numeral 122 denotes a gate conductive layer, reference numeral 124 denotes a first insulating layer for insulating gate conductive layer 122, reference numerals 126 and 126' denote a source and a drain of a transistor, reference numeral 128 denotes a second insulating layer for insulating a bit line contact plug, reference numeral 130 denotes the bit line contact plug for connecting drain 126' of the transistor and a bit line, reference numeral 132 denotes a third insulating layer for insulating a buried contact plug, and reference numeral 136 denotes the buried contact plug for connecting source 126 of the transistor and a storage electrode of a capacitor.

As shown in FIGS. 5B to 5D, reference numeral 103 denotes a trench formed by mask pattern 52 shown in FIG. 4, into substrate 100 for isolating devices and forming the buried bit line, reference numeral 106 denotes the bit line formed into trench 103, and reference numeral 107 denotes an insulating layer for insulating bit line 106.

According to the vertical structure, since bit line contact plug 130 and buried contact plug 136 are formed to be self-aligned with gate conductive layer 122, the X-directional misalignment of the conventional device can be prevented. Further, even though semiconductor substrate 100 and buried contact plug 136 are misaligned by 'm' in the Y-direction (see FIG. 5C and 5D, bit line 106 can be prevented from being shorted to buried contact plug 136 by the depth t of insulating layer 107 between bit line 106 and substrate 100.

The steps for manufacturing the BBL DRAM cell according to the present invention will now be described with reference to FIGS. 6A through 10C.

FIGS. 6A, 6B, and 6C illustrate the step for forming first device isolation region 102.

A trench for a first device isolation is formed into semiconductor substrate 100, for example, to a depth of 3,500–4,500 Å, by mask pattern 50 shown in FIG. 4. Then, an oxide, for example, is deposited on the overall surface of the resultant structure, filling the trench, and then is planarized by a chemical mechanical polishing (CMP) or planarization technology, thereby forming first device isolation region 102.

FIGS. 7A, 7B and 7C illustrate the step for forming a trench 103 for isolating devices and burying a bit line.

A first insulating layer 104 is formed by depositing, for example, an insulating material on the substrate having first device isolation region 102 formed therein. Then, a photoresist is coated on first insulating layer 104, and first insulating layer 104 and substrate 100 are selectively etched by using mask pattern 52 shown in FIG. 4, thereby forming trench 103 to be, for example, approximately 4,000 Å deep. Thereafter, second insulating layer 105 is formed into trench 103 by depositing an insulating material on the overall surface of the substrate and dry-etching the deposited insulating material.

Here, it is desirable to form first insulating layer 104 of a silicon oxide or a silicon nitride to a thickness of 500–1,000 Å, and to deposit second insulating layer 105 of a silicon oxide to a thickness of 500 Å.

In this step, first and second insulating layers 104 and 105 may be formed by depositing an insulating material once, after forming trench 103, or, after forming first insulating layer 104, second insulating layer 105 may be formed by applying an oxidation process to semiconductor substrate 100.

FIGS. 8A, 8B, and 8C illustrate the step for forming buried bit line 106.

An impurity-doped polysilicon, for example, is deposited on the resultant structure, having second insulating layer 105 formed therein, filling trench 103 and then is etched back, thereby forming bit line 106 burying a portion of trench 103. Thereafter, a third insulating layer 108 is formed by depositing, for example, a silicon oxide on bit line 106, filling the remaining portion of trench 103. Then, the resultant structure is planarized by performing a CMP process until the surface of semiconductor substrate 100 is exposed.

In this step, third material layer 108 on bit line 106 is formed to be 1,000–2,000 Å thick.

FIGS. 9A, 9B, and 9C illustrate the step for forming a transistor and bit line contact 130.

Gate insulating film 120 and gate conductive layer 122 are formed on the planarized substrate by sequentially depositing, for example, an oxide to a thickness of 50–200 Å, and polysilicon and then patterning the deposited oxide and polysilicon. Ion-implantation is performed to the resultant structure having gate conductive layer 122 formed therein, thereby forming source 126 and drain 126' of the transistor in the substrate. Thereafter, fourth insulating layer 124 is formed to insulate gate conductive layer 122 by depositing, for example, a silicon nitride to a thickness of 500–1,000 Å and patterning the deposited silicon nitride.

In this step, source 126 and drain 126' may be formed by ion-implanting the substrate after forming fourth insulating layer 124.

Thereafter, a fifth insulating layer 128 for exposing drain 126' and a portion of bit line 106 is formed by depositing, for example, an oxide on the resultant structure having fourth insulating layer 124 formed therein and patterning the deposited oxide. A conductive material, for example, polysilicon, is deposited on the resultant structure having fifth insulating layer 128 formed therein and etched back, thereby forming bit line contact plug 130 for making contact between drain 126' and bit line 106. Thereafter, ions may be implanted into bit line contact plug 130 to reduce the resistivity thereof, and it is desirable to form bit line contact plug layer 130 to sufficiently cover bit line 106 (see FIG. 9B). The ion-implantation of bit line contact plug 130 can be replaced with the outdiffusion of the impurity in bit line 106.

In this step, bit line contact plug 130 is self-aligned by fourth insulating layer 124.

Figure 10C:
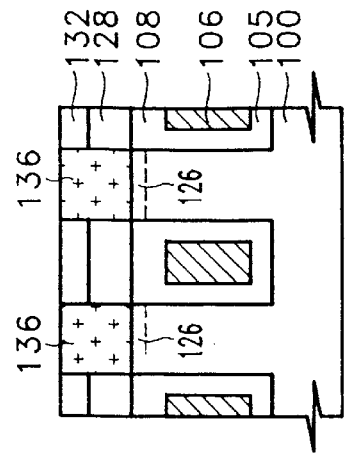
Figure 10B:
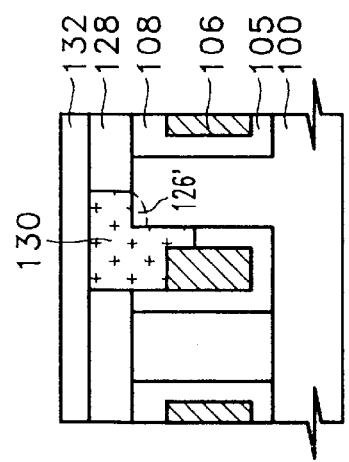
Figure 10A:
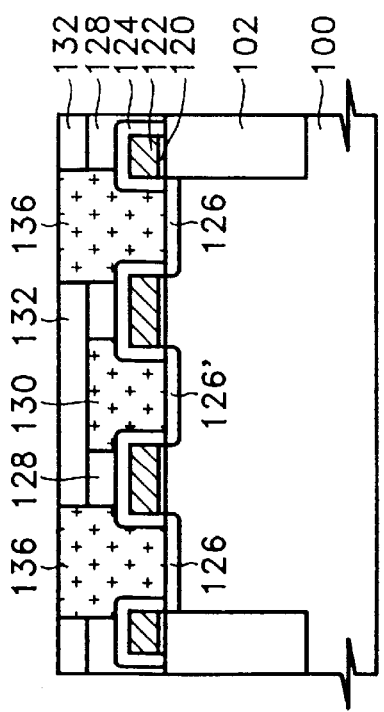

FIGS. 10A, 10B and 10C illustrate the step for forming buried contact plug 136. A sixth insulating layer 132 is formed by depositing, for example, an oxide on the resultant structure having bit line contact plug 130 formed therein, and sixth and fifth insulating layers 132 and 128 are patterned with fifth insulating layer 128 to expose source 126. Thereafter, buried contact plug 136 for making contact between source 126 and a later-formed storage electrode is formed by depositing a conductive material, for example, polysilicon and etching back the deposited polysilicon.

In this step, buried contact plug 136 is self-aligned by fourth insulating layer 124.

A capacitor and the other elements can be formed by usual DRAM manufacturing processes.

In the structure and manufacturing method of the DRAM cell according to an embodiment of the present invention, the self-aligned bit line contact is formed after forming the gate. Thus, the misalignment between the gate and the bit line and excessive exposure to thermal processing which are involved in conventional BBL cells can be avoided and the design rule margin can be improved as well. The present invention is not restricted to the above embodiment, and it is clearly understood that many variations can be possible within the scope and spirit of the present invention by anyone skilled to the art.

What is claimed is:

1. A method for manufacturing a Buried Bit Line DRAM cell comprising the steps of:

forming a trench into a semiconductor substrate for isolating devices and burying a bit line;

forming a first insulating material layer on a surface of said trench;

forming said bit line to a first depth into said trench having said first insulating material layer formed thereon;

forming a second insulating material layer on said bit line while filling a remaining portion of said trench, and planarizing said substrate;

forming a transistor having a gate insulating layer, a source/drain, and a gate on said planarized substrate;

forming a first insulating layer to insulate said gate;

forming a second insulating layer on the resultant structure having said first insulating layer formed therein;

exposing said drain of said transistor and said bit line by partially etching said second insulating layer;

forming a bit line contact plug for making contact between said drain and said bit line by depositing a conductive material on the resultant structure after exposing said drain;

forming a third insulating layer on the resultant structure having said bit line contact plug formed therein and etching said third and second insulating layers to expose said source of said transistor; and forming a buried contact plug by depositing a conductive material on the resultant structure after exposing said source and etching back said conductive material.

2. A method for manufacturing a Buried Bit Line DRAM cell as claimed in claim 1, wherein said trench is formed to a depth of 3,500–4,500 Å.

3. A method for manufacturing a Buried Bit Line DRAM cell as claimed in claim 1, wherein said first material layer is formed to a thickness of 500–1,000 Å and second material layer is formed to a thickness of 1,000–2,000 Å.

4. A method for manufacturing a Buried Bit Line DRAM cell as claimed in claim 1, wherein said first and second material layers are formed of an oxide.

5. A method for manufacturing a Buried Bit Line DRAM cell as claimed in claim 1, wherein in said step of partial etching said second insulating layer, said buried bit line is exposed by over-etching said second insulating layer.

6. A method for manufacturing a Buried Bit Line DRAM cell as claimed in claim 1, wherein an etch rate of said first insulating layer is different from etch rates of said second and third insulating layers.

* * * * *